United States Patent
Wong et al.

(10) Patent No.: US 10,269,571 B2
(45) Date of Patent: Apr. 23, 2019

(54) METHODS FOR FABRICATING NANOWIRE FOR SEMICONDUCTOR APPLICATIONS

(71) Applicant: Applied Materials, Inc., Santa Clara, CA (US)

(72) Inventors: Keith Tatseun Wong, Los Gatos, CA (US); Shiyu Sun, Santa Clara, CA (US); Sean S. Kang, San Ramon, CA (US); Nam Sung Kim, Sunnyvale, CA (US); Srinivas D. Nemani, Sunnyvale, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/648,163

(22) Filed: Jul. 12, 2017

(65) Prior Publication Data

US 2019/0019681 A1    Jan. 17, 2019

(51) Int. Cl.
*H01L 29/423* (2006.01)
*H01L 29/06* (2006.01)
(Continued)

(52) U.S. Cl.
CPC .. *H01L 21/28158* (2013.01); *H01L 21/02532* (2013.01); *H01L 21/02614* (2013.01);
(Continued)

(58) Field of Classification Search
CPC ........... H01L 29/0673; H01L 29/66439; H01L 29/775
See application file for complete search history.

(56) References Cited

U.S. PATENT DOCUMENTS

| 5,114,513 A | 5/1992 | Hosokawa et al. |
| 5,149,378 A | 9/1992 | Ohmi et al. |

(Continued)

FOREIGN PATENT DOCUMENTS

| JP | 2007242791 A | 9/2007 |
| JP | 2013516788 A | 5/2013 |

(Continued)

OTHER PUBLICATIONS

International Search Report and Written Opinion for PCT/US2018/021715 dated Jun. 22, 2018.

(Continued)

*Primary Examiner* — Changhyun Yi
(74) *Attorney, Agent, or Firm* — Patterson + Sheridan, LLP

(57) ABSTRACT

The present disclosure provide methods for forming nanowire structures with desired materials horizontal gate-all-around (hGAA) structures field effect transistor (FET) for semiconductor chips. In one example, a method of forming nanowire structures on a substrate includes supplying an oxygen containing gas mixture to a multi-material layer on a substrate in a processing chamber, wherein the multi-material layer includes repeating pairs of a first layer and a second layer, the first and the second layers having a first group and a second group of sidewalls respectively exposed through openings defined in the multi-material layer, maintaining a process pressure at greater than 5 bar, and selectively forming an oxidation layer on the second group of sidewalls in the second layer.

20 Claims, 5 Drawing Sheets

(51) Int. Cl.
*H01L 21/02* (2006.01)
*H01L 21/28* (2006.01)
*H01L 21/321* (2006.01)
*H01L 29/66* (2006.01)

(52) U.S. Cl.
CPC .. *H01L 21/28114* (2013.01); *H01L 21/32105* (2013.01); *H01L 29/66795* (2013.01)

(56) References Cited

U.S. PATENT DOCUMENTS

| | | | |
|---|---|---|---|
| 5,319,212 | A | 6/1994 | Tokoro |
| 5,879,756 | A | 3/1999 | Fathi et al. |
| 5,880,041 | A * | 3/1999 | Ong ............... H01L 21/02238 257/E21.285 |
| 5,940,985 | A | 8/1999 | Kamikawa et al. |
| 6,082,950 | A | 7/2000 | Altwood et al. |
| 6,150,286 | A | 11/2000 | Sun et al. |
| 6,242,368 | B1 | 6/2001 | Holmer et al. |
| 6,251,751 | B1 | 6/2001 | Chu et al. |
| 6,319,766 | B1 | 11/2001 | Bakli et al. |
| 6,500,603 | B1 | 12/2002 | Shioda |
| 6,797,336 | B2 | 9/2004 | Garvey et al. |
| 7,460,760 | B2 | 12/2008 | Cho et al. |
| 7,503,334 | B1 | 3/2009 | Shrinivasan et al. |
| 7,521,089 | B2 | 4/2009 | Hillman et al. |
| 7,521,378 | B2 | 4/2009 | Fucsko et al. |
| 7,867,923 | B2 | 1/2011 | Mallick et al. |
| 8,027,089 | B2 | 9/2011 | Hayashi |
| 8,318,584 | B2 | 11/2012 | Li et al. |
| 8,349,085 | B2 | 1/2013 | Tahara et al. |
| 8,449,942 | B2 | 5/2013 | Liang et al. |
| 8,481,123 | B2 | 7/2013 | Kim et al. |
| 8,557,712 | B1 | 10/2013 | Antonelli et al. |
| 8,741,788 | B2 | 6/2014 | Liang et al. |
| 8,936,834 | B2 | 1/2015 | Kim et al. |
| 9,121,515 | B2 | 9/2015 | Yamamoto et al. |
| 9,153,442 | B2 | 10/2015 | Wang et al. |
| 9,257,314 | B1 | 2/2016 | Rivera et al. |
| 9,306,026 | B2 | 4/2016 | Toriumi et al. |
| 9,484,406 | B1 * | 11/2016 | Sun .................... H01L 29/413 |
| 9,570,551 | B1 * | 2/2017 | Balakrishnan ...... H01L 29/0673 |
| 2001/0029108 | A1 | 10/2001 | Tometsuka |
| 2001/0041122 | A1 | 11/2001 | Kroeker |
| 2002/0122885 | A1 | 9/2002 | Ahn |
| 2002/0151128 | A1 | 10/2002 | Lane et al. |
| 2003/0030945 | A1 | 2/2003 | Heinonen et al. |
| 2003/0207593 | A1 | 11/2003 | Derderian et al. |
| 2004/0060519 | A1 | 4/2004 | Beauchaine et al. |
| 2004/0248392 | A1 | 12/2004 | Narwankar et al. |
| 2005/0003655 | A1 | 1/2005 | Cathey et al. |
| 2005/0051194 | A1 | 3/2005 | Sakashita et al. |
| 2005/0191828 | A1 | 9/2005 | Al-Bayati et al. |
| 2005/0269291 | A1 | 12/2005 | Kent |
| 2006/0226117 | A1 | 10/2006 | Bertram et al. |
| 2006/0290017 | A1 | 12/2006 | Yanagisawa |
| 2007/0187386 | A1 | 8/2007 | Kim et al. |
| 2008/0074658 | A1 | 3/2008 | Davis et al. |
| 2008/0210273 | A1 | 9/2008 | Joe |
| 2009/0180847 | A1 | 7/2009 | Guo et al. |
| 2009/0186481 | A1 | 7/2009 | Suzuki et al. |
| 2009/0233449 | A1 | 9/2009 | Lebouitz et al. |
| 2009/0243126 | A1 | 10/2009 | Washiya et al. |
| 2010/0173495 | A1 | 7/2010 | Thakur et al. |
| 2010/0304027 | A1 | 12/2010 | Lee et al. |
| 2010/0327422 | A1 | 12/2010 | Lee et al. |
| 2012/0142192 | A1 | 6/2012 | Li et al. |
| 2012/0252210 | A1 | 10/2012 | Tohnoe |
| 2012/0285492 | A1 | 11/2012 | Lee et al. |
| 2013/0330042 | A1 | 12/2013 | Nara et al. |
| 2013/0337171 | A1 | 12/2013 | Sasagawa |
| 2014/0023320 | A1 | 1/2014 | Lee et al. |
| 2014/0076494 | A1 | 3/2014 | Miyashita et al. |
| 2014/0138802 | A1 | 5/2014 | Starostine et al. |
| 2014/0231384 | A1 | 8/2014 | Underwood et al. |
| 2014/0264237 | A1 | 9/2014 | Chen et al. |
| 2014/0284821 | A1 | 9/2014 | Hubbard |
| 2015/0050807 | A1 | 2/2015 | Wu et al. |
| 2015/0159272 | A1 | 6/2015 | Yoon et al. |
| 2015/0255581 | A1 | 9/2015 | Lin et al. |
| 2015/0309073 | A1 | 10/2015 | Mirkin et al. |
| 2015/0364348 | A1 | 12/2015 | Park et al. |
| 2016/0035600 | A1 | 2/2016 | Rivera et al. |
| 2016/0064482 | A1 * | 3/2016 | Hashemi ........... H01L 29/42392 257/9 |
| 2016/0076149 | A1 | 3/2016 | Yamazaki et al. |
| 2016/0118391 | A1 | 4/2016 | Zhao et al. |
| 2016/0208414 | A1 | 7/2016 | Odawara et al. |
| 2016/0260526 | A1 | 9/2016 | Otto |
| 2016/0334162 | A1 | 11/2016 | Kim et al. |
| 2016/0353522 | A1 | 12/2016 | Rathi et al. |
| 2017/0011932 | A1 | 1/2017 | Pethe et al. |
| 2017/0104062 | A1 | 4/2017 | Bi et al. |
| 2017/0140996 | A1 | 5/2017 | Lin et al. |
| 2017/0160012 | A1 | 6/2017 | Kobayashi et al. |
| 2017/0194430 | A1 | 7/2017 | Wood et al. |
| 2018/0019249 | A1 | 1/2018 | Zhang et al. |

FOREIGN PATENT DOCUMENTS

| | | |
|---|---|---|
| JP | 2014019912 A | 2/2014 |
| KR | 20070075383 A | 7/2007 |
| KR | 1020090040867 A | 4/2009 |
| KR | 20140003776 A | 1/2014 |
| KR | 20150122432 A | 11/2015 |
| WO | 2016065219 A1 | 4/2016 |

OTHER PUBLICATIONS

International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.

* cited by examiner

METHODS FOR FABRICATING NANOWIRE FOR SEMICONDUCTOR APPLICATIONS

BACKGROUND

Field

Embodiments of the present invention generally relate to methods for forming vertically stacked nanowires with desired materials on a semiconductor substrate, and more particularly to methods for forming vertically stacked nanowires on a semiconductor substrate with desired materials for semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 25 nm and 20 nm dimensions and beyond, whereas the thickness of the dielectric layers remain substantially constant, with the result of increasing the aspect ratios of the features. Furthermore, reduced channel length often causes significant short channel effect with conventional planar MOSFET architecture. In order to enable fabrication of next generation devices and structures, a three dimensional (3D) device structure is often utilized to improve performance of the transistors. In particular, fin field effect transistors (FinFET) are often utilized to enhance device performance. FinFET devices typically include semiconductor fins with high aspect ratios in which the channel and source/drain regions for the transistor are formed thereover. A gate electrode is then formed over and alongside of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow. Device structures with hGAA configurations often provide superior electrostatic control by surrounding gate to suppress short channel effect and associated leakage current.

In some applications, horizontal gate-all-around (hGAA) structures are utilized for next generation semiconductor device applications. The hGAA device structure includes several lattice matched channels (e.g., nanowires) suspended in a stacked configuration and connected by source/drain regions.

In hGAA structures, different materials are often utilized to form the channel structures (e.g., nanowires), which may undesirably increase the manufacturing difficulty in integrating all these materials in the nanowire structures without deteriorating the device performance. For example, one of the challenges associated with hGAA structures include the existence of large parasitic capacitance between the metal gate and source/drain. Improper management of such parasitic capacitance may result in much degraded device performance.

Thus, there is a need for improved methods for forming channel structures for hGAA device structures on a substrate with good profile and dimension control.

SUMMARY

The present disclosure provides methods for forming nanowire structures with desired materials horizontal gate-all-around (hGAA) structures for semiconductor chips. In one example, a method of forming nanowire structures on a substrate includes supplying an oxygen containing gas mixture to a multi-material layer on a substrate in a processing chamber, wherein the multi-material layer includes repeating pairs of a first layer and a second layer, the first and the second layers having a first group and a second group of sidewalls respectively exposed through openings defined in the multi-material layer, maintaining a process pressure at greater than 5 bar, and selectively forming an oxidation layer on the second group of sidewalls in the second layer.

In another example, a method of forming nanowire structures on a substrate includes predominantly forming an oxidation layer on a portion of a multi-material layer disposed on a substrate, wherein the multi-material layer includes repeating pairs of a first layer and a second layer, the first and second layers having a first group and a second group of sidewalls respectively exposed through openings defined in the multi-material layer, wherein the oxidation layer is selectively formed on the second group of the sidewalls in the second layer, and maintaining a process pressure at greater than 5 bar while forming the oxidation layer.

In yet another example, a method of forming nanowire structures on a substrate includes predominantly forming an oxidation layer on a portion of a multi-material layer disposed on a substrate, wherein the multi-material layer includes repeating pairs of a silicon layer and a SiGe layer, the silicon layer and the SiGe layer having a first group and a second group of sidewalls respectively exposed through openings defined in the multi-material layer, wherein the portion wherein the oxidation layer is selectively formed on is on the second group of the sidewalls in the SiGe layer, and maintaining a process pressure at greater than 5 bar while forming the oxidation layer.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Methods for manufacturing nanowire structures with controlled parasitic capacitance for a horizontal gate-all-around (hGAA) semiconductor device structure are provided. In one example, a superlattice structure comprising different materials (e.g., a first material and a second material) arranged in an alternatingly stacked formation may be formed on a substrate to be later utilized as nanowires (e.g., channel structures) for horizontal gate-all-around (hGAA) semiconductor device structures. A selective oxidation process may be performed to selectively form an oxidation layer on sidewalls of the first material in the superlattice structure with minimum oxidation occurred on the second material. The oxidation selectivity on sidewalls of the first material to the second material in the superlattice structure is greater than 5:1. By doing so, the interface where the parasitic device is formed between the nanowires and the source/drain regions are maintained and controlled so as to efficiently reduce parasitic capacitance.

Figure 1:
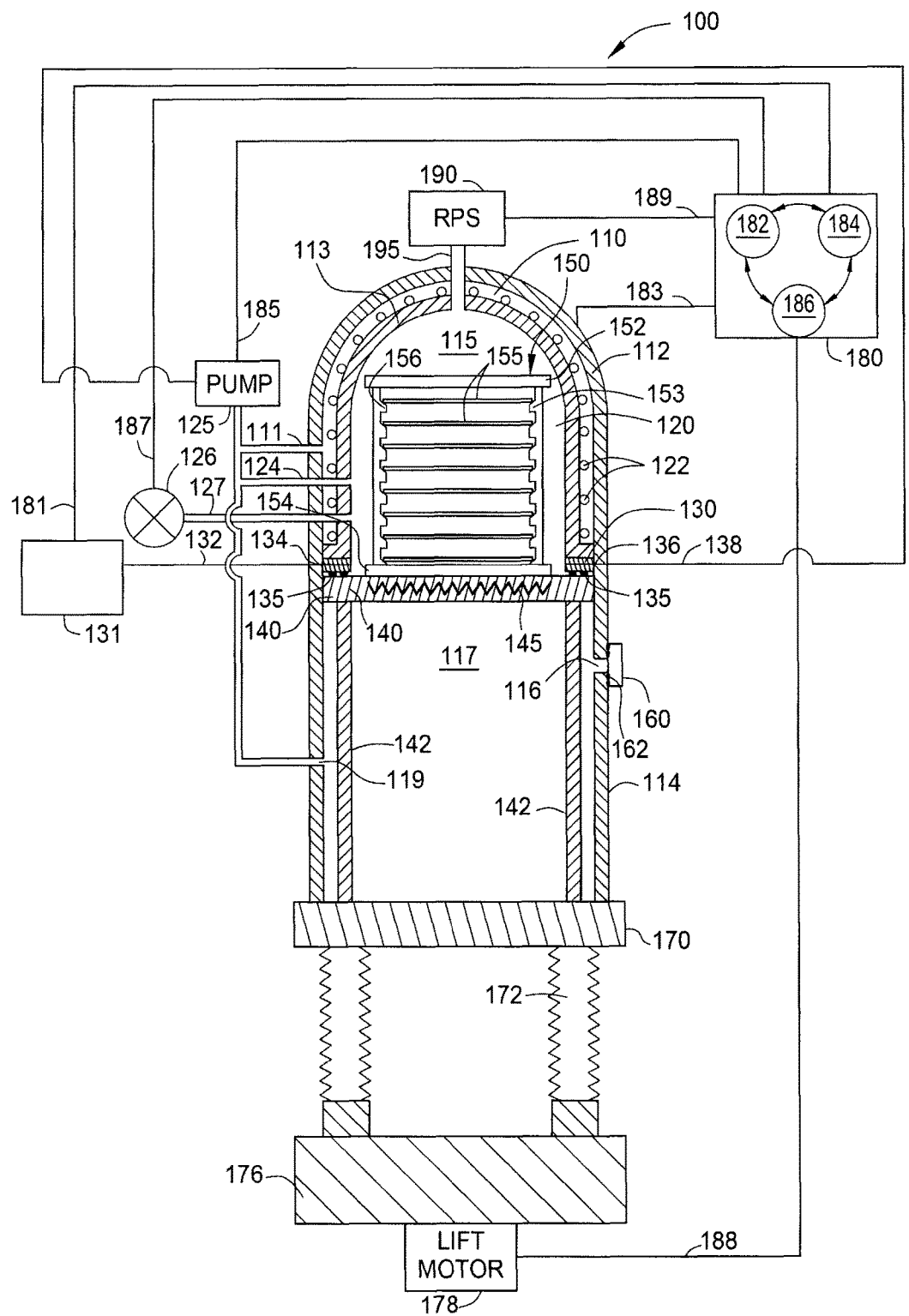
FIG. 1 is a simplified front cross-sectional view of a batch processing chamber with a cassette disposed therein in accordance with some embodiments.

FIG. 1 is a simplified front cross-sectional view of the batch processing chamber. Although the processing chamber depicted in FIG. 1 include a batch of substrates that may be simultaneously processed in the processing chamber, it is noted that the processing chamber 100 may be configured to process a single substrate in each process as needed.

The batch processing chamber 100 has an upper shell 112 disposed on a lower shell 114. An inner shell 113 is disposed within the upper shell 112 such that an outer chamber 110 and an inner chamber 120 are formed. The inner shell 113 and the upper shell 112 bound the outer chamber 110. The inner shell 113 and the lower shell 114 bound the inner chamber 120. The outer chamber 110 is isolated from the inner chamber 120. A bottom plate 170 is coupled to the bottom surface of the lower shell 114. The inner chamber 120 has a high-pressure region 115 and a low-pressure region 117. The exteriors of the upper shell 112 and lower shell 114 may be made from a corrosion resistant steel (CRS), such as but not limited to stainless steel. The interiors of the inner shell 113, the upper shell 112 and the lower shell 114 as well as the bottom plate 170 may be made from nickel-based steel alloys that exhibit high resistance to corrosion, such as but not limited to Hastelloy®.

One or more heaters 122 are disposed within the outer chamber 110. As further discussed below, the environment within the outer chamber 110 is maintained at a vacuum to improve the performance of the heaters 122 and exhaust any leaks from the high pressure inner chamber 120. In the embodiment shown in FIG. 1, the heaters 122 are coupled to the inner shell 113. In other embodiments, the heaters 122 may be coupled to the upper shell 112. The heaters 122 are operable such that when the heaters 122 are turned on, the heaters 122 are able to heat the inner shell 113 and thus, also heat the high-pressure region 115 within the inner chamber 120. The heaters 122 may be a resistive coil, a lamp, a ceramic heater, a graphite-based carbon fiber composite (CFC) heater, a stainless steel heater or an aluminum heater. Power to the heaters 122 is controlled by a controller 180 through feedback received from sensors (not shown), monitoring the temperature of the inner chamber 120.

A lift plate 140 is disposed within the inner chamber 120. The lift plate 140 is supported by one or more rods 142 on the bottom plate 170 of the inner chamber 120. The bottom plate 170 is coupled to a platform 176 connected to a lifting mechanism 178. In some embodiments, the lifting mechanism 178 may be a lift motor or other suitable linear actuator. In the embodiment shown in FIG. 1, a bellows 172 is utilized to seal the platform 176 to the bottom plate 170. The bellows 172 is attached to the bottom plate 170 by a fastening mechanism, such as but not limited to the clamps. Thus, the lift plate 140 is coupled to the lifting mechanism 178 that raises and lowers the lift plate 140 within the inner chamber 120. The lifting mechanism 178 raises the lift plate 140 to seal the high-pressure region 115. The lift plate 140 and lifting mechanism 178 are configured to function against a high downward pressure, for example pressures of about 50 bars, in the high-pressure region of the inner chamber when the lift plate 140 is in a raised position. The lifting mechanism 178 lowers the lift plate 140 to allow fluid communication between the high-pressure region 115 and the low-pressure region 117, and to facilitate substrate transfer into and out of the batch processing chamber 100. The operation of the lifting mechanism 178 is controlled by the controller 180.

A heating element 145 is interfaced with the lift plate 140. The heating element 145 is operated to heat the high-pressure region 115 within the inner chamber 120 during processing as well as pre-processing. The heating element 145 may be a resistive coil, a lamp, or a ceramic heater. In the embodiment depicted in FIG. 1, the heating element 145 is a resistive heater coupled to or disposed in the lift plate 140. Power to the heating element 145 is controlled by the controller 180 through feedback received from sensors (not shown), monitoring the temperature of the inner chamber 120.

High-pressure seals 135 are utilized to seal the lift plate 140 to the inner shell 113 in order to seal the high-pressure region 115 for processing. The high-pressure seal 135 may be made from a polymer, such as but not limited to a perfluoroelastomer. The batch processing chamber 100 includes at least one injection port 134 and one or more outlet ports 136. The injection port 134 is configured to introduce a fluid into the inner chamber 120 while the one or more outlet ports 136 is configured to remove the fluid from the inner chamber 120.

In some embodiments, the inner shell 113 may be coupled to an injection ring 130 that has a cylindrical annulus shape around the inner chamber 120. The injection ring 130 is removably coupled to a bottom surface of the inner shell 113. The cassette 150 is disposed on the lift plate 140. The cassette 150 has a top surface 152, a bottom surface 154, and a wall 153. The wall 153 of the cassette 150 has a plurality of substrate storage slots 156. Each substrate storage slot 156 is configured to hold a substrate 155 therein. Each substrate storage slot 156 is evenly spaced along the wall 153 of the cassette 150. The cassette 150 may have as many as twenty-four or more substrate storage slots.

A substrate transfer port 116 formed through the lower shell 114 is utilized to load the substrates 155 onto the cassette 150. The substrate transfer port 116 has a door 160.

The door 160 is configured to cover the substrate transfer port 116 before and after the substrates 155 are loaded. The door 160 may be made from nickel-based steel alloys that exhibit high resistance to corrosion, such as but not limited to Hastelloy® and may be water-cooled. Vacuum seals 162 are provided to seal the door 160 and the substrate transfer port 116 and thus prevent the leakage of air into the inner chamber 120 when the door 160 is in a closed position.

A remote plasma source (RPS) 190 is connected to the inner chamber 120 by an inlet 195 and configured to generate gaseous radicals that flow through the inlet 195 into the inner chamber 120 to clean the interior of the inner chamber 120 after processing one or more batches of substrates 155. Remote plasma source 190 may be a radio frequency (RF) or very high radio frequency (VHRF) capacitively coupled plasma (CCP) source, an inductively coupled plasma (ICP) source, a microwave induced (MW) plasma source, a DC glow discharge source, an electron cyclotron resonance (ECR) chamber, or a high density plasma (HDP) chamber. The remote plasma source 190 is operatively coupled to one or more sources of gaseous radicals, where the gas may be at least one of disiline, ammonia, hydrogen, nitrogen or an inert gas like argon or helium. The controller 180 controls the generation as well as the distribution of gaseous radicals activated in the remote plasma source 190.

A vacuum pump 125 is connected to the batch processing chamber 100, as shown in FIG. 1. The vacuum pump 125 is configured to evacuate the outer chamber 110 through an exhaust pipe 111, the high-pressure region 115 of the inner chamber 120 through an exhaust pipe 124 and the low-pressure region 117 of the inner chamber 120 through an exhaust pipe 119. The vacuum pump 125 is also connected to an outlet tube 138 connected to the one or more outlets port(s) 136 for removing any fluid from the inner chamber 120. A vent valve 126 is connected to the high-pressure region 115 of the inner chamber 120. The vent valve 126 is configured to vent the inner chamber 120 through a vent pipe 127 so that the pressure is released in the high-pressure region 115 prior to lowering the lift plate 140 and cassette 150. The operation of the vacuum pump 125 and the vent valve 126 is controlled by the controller 180.

The controller 180 controls the operation of the batch processing chamber 100 as well as the remote plasma source 190. The controller 180 is communicatively connected to the fluid source 131 and sensors (not shown) measuring various parameters of the inner chamber 120 by connecting wires 181 and 183 respectively. The controller 180 is communicatively connected to the pump 125 and the vent valve 126 by connecting wires 185 and 187 respectively. The controller 180 is communicatively connected to the lifting mechanism 178 and the remote plasma source 190 by connectors 188 and 189 respectively. The controller 180 includes a central processing unit (CPU) 182, a memory 184, and a support circuit 186. The CPU 182 may be any form of general purpose computer processor that may be used in an industrial setting. The memory 184 may be random access memory, read only memory, floppy, or hard disk drive, or other form of digital storage. The support circuit 186 is conventionally coupled to the CPU 182 and may include cache, clock circuits, input/output systems, power supplies, and the like.

The batch processing chamber 100 advantageously creates isolation between the high-pressure region 115 and the low-pressure region 117 within the inner chamber 120 such that the processing fluid 659 can be flowed across the substrate 155 placed in the high-pressure region 115 while maintaining the substrates 155 at a high temperature.

In operation, a processing fluid introduced through the injection port 134. The processing fluid is removed through the one or more outlet ports 136 using the pump 125. Exposure to the processing fluid at a high pressure while the substrate 155 is maintained at a high temperature causes a reaction to occur between the substrate and the processing fluid, thereby forming a material layer, such as an oxide layer, nitride layer or any suitable layers on the substrate.

The processing fluid may comprise an oxygen-containing and/or nitrogen-containing gas, such as oxygen, steam, water, hydrogen peroxide, and/or ammonia may be utilized. Alternatively or in addition to the oxygen-containing and/or nitrogen-containing gases, the processing fluid may comprise a silicon-containing gas. Examples of the silicon-containing gas include organosilicon, tetraalkyl orthosilicate gases and disiloxane. Organosilicon gases include gases of organic compounds having at least one carbon-silicon bond. Tetraalkyl orthosilicate gases include gases consisting of four alkyl groups attached to an $SiO_4^{4-}$ ion. More particularly, the one or more gases may be (dimethylsilyl)(trimethylsilyl)methane $((Me)_3SiCH_2SiH(Me)_2)$, hexamethyldisilane $((Me)_3SiSi(Me)_3)$, trimethylsilane $((Me)_3SiH)$, trimethylsilylchloride $((Me)_3SiCl)$, tetramethylsilane $((Me)_4Si)$, tetraethoxysilane $((EtO)_4Si)$, tetramethoxysilane $((MeO)_4Si)$, tetrakis-(trimethylsilyl)silane $((Me_3Si)_4Si)$, (dimethylamino)dimethyl-silane $((Me_2N)SiHMe_2)$ dimethyldiethoxysilane $((EtO)_2Si(Me)_2)$, di methyl-dimethoxysilane $((MeO)_2Si(Me)_2)$, methyltrimethoxysilane $((MeO)_3Si(Me))$, dimethoxytetramethyl-disiloxane $(((Me)_2Si(OMe))_2O)$, tris (dimethylamino)silane $((Me_2N)_3SiH)$, bis(dimethylamino) methylsilane $((Me_2N)_2CH_3SiH)$, disiloxane $((SiH_3)_2O)$, and combinations thereof.

During processing of the substrates 155, an environment of the high-pressure region 115 is maintained at a temperature and pressure that maintains the processing fluid within the high-pressure region in a vapor phase. Such pressure and temperature is selected based on the composition of the processing fluid. In one example, high-pressure region 115 is pressurized to a pressure greater than atmosphere, for example greater than about 5 bars. In another example, high-pressure region 115 is pressurized to a pressure from between about 10 and about 60 bars, such as from between about 20 and about 50 bars. In another example, the high-pressure region 115 is pressurized to a pressure up to about 200 bars. During processing, the high-pressure region 115 is also maintained at a high temperature, for example, a temperature exceeding 225 degrees Celsius (limited by the thermal budget of the substrates 155 disposed on the cassette 150), such as between about 300 degrees Celsius and about 450 degrees Celsius, by the heaters 122 disposed within the outer chamber 110. The heating element 145 interfaced with the lift plate 140 may assist heating of the substrates 155, but may optionally be turned off.

The architecture of the batch processing chamber 100 advantageously creates isolation within the inner chamber 120 of the batch processing chamber 100 by separating the high-pressure region 115 and the low-pressure region 117 during processing, while the low-pressure region 117 remains in vacuum. The substrates are loaded and unloaded onto a cassette when the isolation is removed. The isolation allows thermal separation between two distinct environments: one for processing in the high-pressure region and the other for loading/unloading the substrates in the low-pressure region. The isolation also prevents thermal inconsistencies among the components of the chamber by keeping the high-pressure region enclosed during processing.

Figure 2:
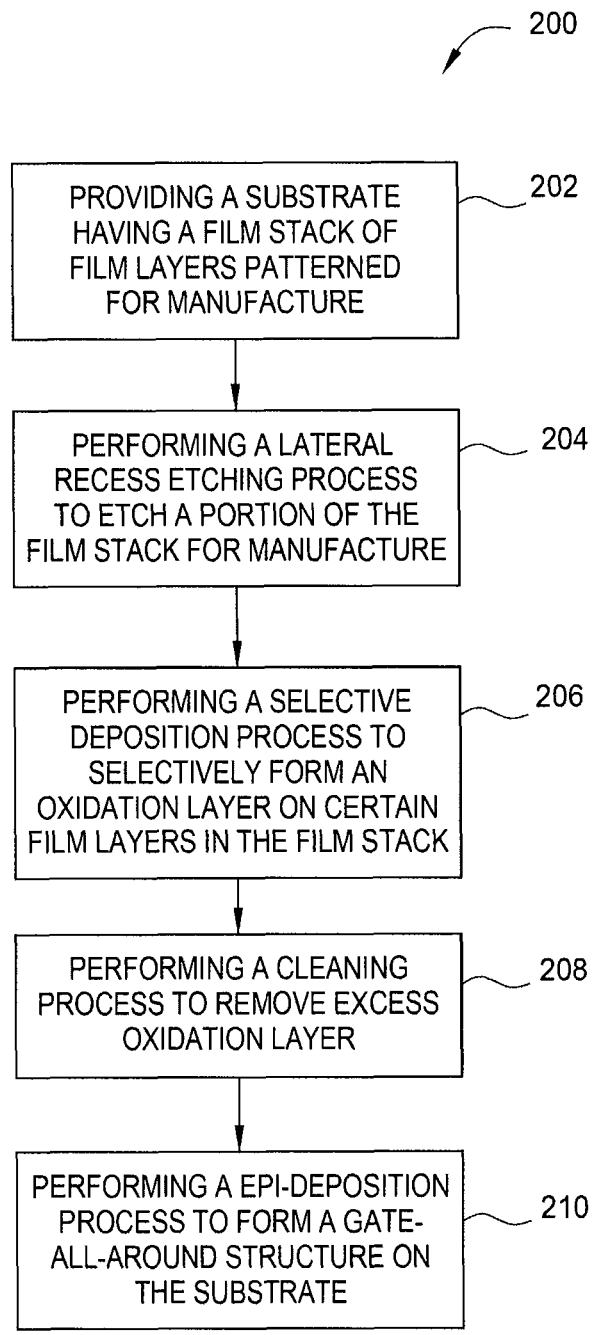
FIG. 2 depicts a flow diagram of a method for manufacturing nanowire structures formed on a substrate.

FIG. 2 is a flow diagram of one example of a method 300 for manufacturing nanowire structures (e.g., channel structures) with composite materials for horizontal gate-all-around (hGAA) semiconductor device structures. FIGS. 3A-3F are cross-sectional views of a portion of a composite substrate corresponding to various stages of the method 200. The method 200 may be utilized to form the nanowire structure for horizontal gate-all-around (hGAA) semiconductor device structures on a substrate having desired materials which may later be utilized to form a field effect transistor (FET). Alternatively, the method 200 may be beneficially utilized to manufacture other types of structures.

Figure 3A:
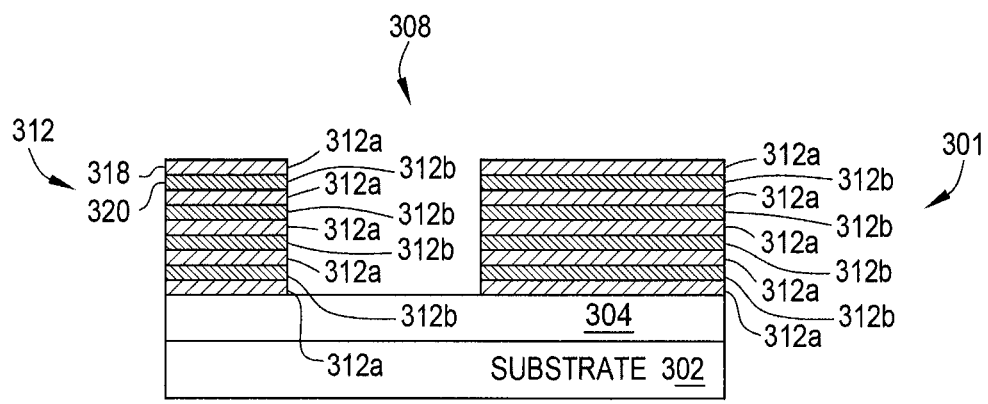
FIGS. 3A-3F depict cross sectional views of one example of a sequence for forming a nanowire structure with desired materials during the manufacturing process of FIG. 2.

The method 200 begins at operation 202 by providing a substrate having a film stack 301 formed thereon, as shown in FIG. 3A. The substrate 302 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 502 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

The film stack 301 includes a multi-material layer 312 disposed on an optional material layer 304. In the embodiments wherein the optional material layer 304 is not present, the film stack 301 may be directly formed on the substrate 302 as needed. In one example, the optional material layer 304 is an insulating material. Suitable examples of the insulating material may include silicon oxide material, silicon nitride material, silicon oxynitride material, or any suitable insulating materials. Alternatively, the optional material layer 304 may be any suitable materials including conductive material or non-conductive material as needed. The multi-material layer 312 includes at least one pair of layers, each pair comprising a first layer 312a and a second layer 312b. Although the example depicted in FIG. 3A shows four pairs, each pair including the first layer 312a and the second layer 312b (alternating pairs, each pair comprising the first layer 312a and the second layer 312b), it is noted that number of pairs, each comprising a first layer 312a and a second layer 312b, may be varied based on different process needs. In one example, the multi-material layer 312 includes at least two or four pair of layers. In one particular embodiment, 4 pairs of the first and second layers, 312a, 312b may be deposited to form the multi-material layer 312 on the substrate 302. In one implementation, the thickness of each single first layer 312a may be at between about 20 Å and about 200 Å, such as about 50 Å, and the thickness of the each single second layer 312b may be at between about 20 Å and about 200 Å, such as about 50 Å. The multi-material layer 312 may have a total thickness between about 10 Å and about 5000 Å, such as between about 40 Å and about 4000 Å.

The first layer 312a may be a crystalline silicon layer, such as a single crystalline, polycrystalline, or monocrystalline silicon layer, formed by an epitaxial deposition process. Alternatively, the first layer 312a may be a doped silicon layer, including a p-type doped silicon layer or a n-type doped layer. Suitable p-type dopant includes B dopants, Al dopants, Ga dopants, In dopants, or the like. Suitable n-type dopant includes N dopants, P dopants, As dopants, Sb dopants, or the like. In yet another example, the first layer 312a may be a group III-V material, such as a GaAs layer. The second layer 312b may be a Ge containing layer, such as a SiGe layer, Ge layer, or other suitable layer. Alternatively, the second layer 312b may be a doped silicon layer, including a p-type doped silicon layer or a n-type doped layer. In yet another example, the second layer 312b may be a group III-V material, such as a GaAs layer. In still another example, the first layer 312a may be a silicon layer and the second layer 312b is a metal material having a high-k material coating on outer surfaces of the metal material. Suitable examples of the high-k material includes hafnium dioxide ($HfO_2$), zirconium dioxide ($ZrO_2$), hafnium zirconium oxide ($HfZrO_4$), hafnium silicate oxide ($HfSiO_4$), hafnium aluminum oxide (HfAlO), zirconium silicate oxide ($ZrSiO_4$), tantalum dioxide ($TaO_2$), aluminum oxide, aluminum doped hafnium dioxide, bismuth strontium titanium (BST), or platinum zirconium titanium (PZT), among others. In one particular implementation the coating layer is a hafnium dioxide ($HfO_2$) layer.

In the particular example depicted in FIG. 3A, the first layer 312a is a crystalline silicon layer, such as a single crystalline, polycrystalline, or monocrystalline silicon layer. The second layer 312b is a SiGe layer.

In some examples, a hardmask layer (not shown in FIG. 3A) and/or a patterned photoresist layer may be disposed on the multi-material layer 312 for patterning the multi-material layer 312. In the example shown in FIG. 3A, the multi-material layer 312 has been patterned in the previous patterning processes to form openings 308, which may later have source/drain anchors formed therein, in the multi-material layer 312.

In the implementation wherein the substrate 302 is a crystalline silicon layer and the insulating layer 304 is a silicon oxide layer, the first layer 312a may be intrinsic epi-silicon layer and the second layer 312b is a SiGe layer. In another implementation, the first layer 312a may be a doped silicon containing layer and the second layer 312b may be an intrinsic epi-silicon layer. The doped silicon containing layer may be a p-type dopant or a n-type dopant, or a SiGe layer as needed. In yet another implementation wherein the substrate 302 is a Ge or GaAs substrate, the first layer 312a may be a GeSi layer and the second layer 312b may be an intrinsic epi-Ge layer or vice versa. In still another implementation wherein the substrate 302 is a GaAs layer with dominantly a crystalline plane at <100>, the first layer 312a may be an intrinsic Ge layer and the second layer 312b is a GaAs layer or vice versa. It is noted that the selection of the substrate materials along with the first layer 312a and the second layer 312b in the multi-material layer 312 may be in different combinations utilizing the materials listed above.

Figure 3B:
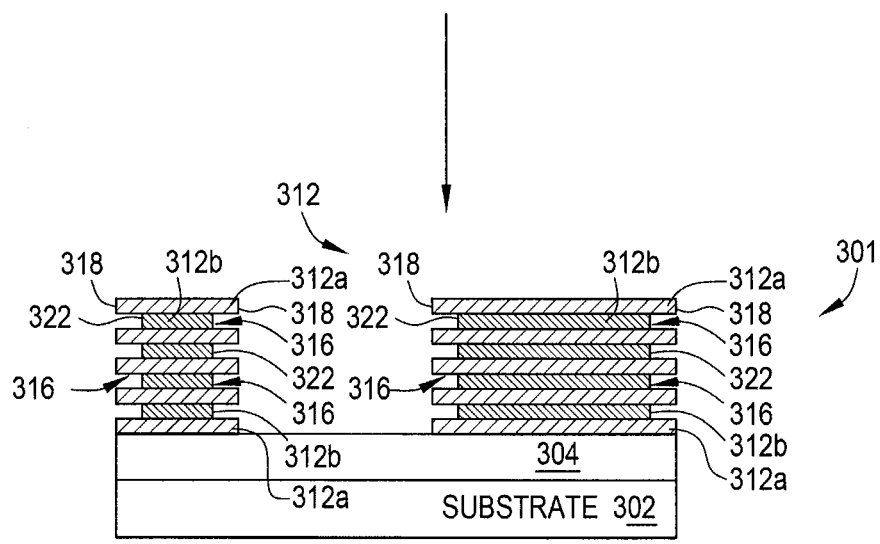
Figure 3C:
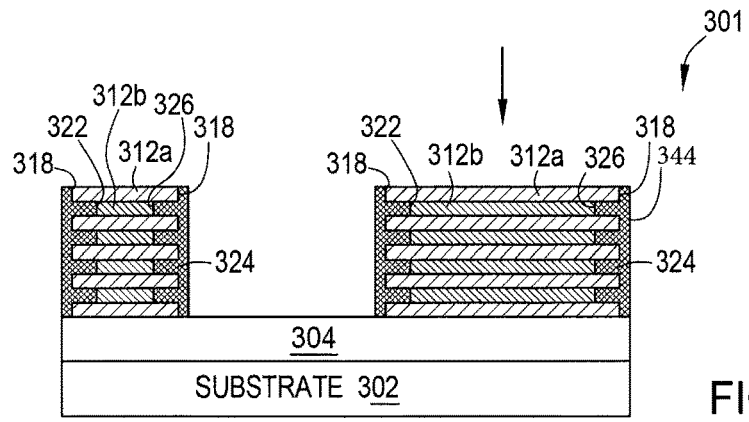

At operation 204, a lateral etching process is performed to laterally remove a portion of the second layer 312b from its sidewalls 320 from the film stack 312, as shown in FIG. 3B. The lateral etching process is performed to selectively remove (partially or entirely) one type of material from the substrate 302. For example, the second layer 312b may be partially removed as depicted in FIG. 3B, forming a recess 316 at each sidewall 320 of the second layer 312b, forming an exposed sidewall 322 of the second layer 312b. Alternatively, during the lateral etching process, the first layer 312a may be partially removed as needed (not shown) from its sidewall 318, rather than the second layer 312b depicted in FIG. 3B.

Based on different process requirements, different etching precursors are selected to selectively and specifically etch either the first layer 312a or the second layer 312b from the substrate 302 to form the recess 316. As the first and the second layers 312a, 312b on the substrate 302 has substantially the same dimensions and have sidewalls 318, 320 (shown FIG. 3A) exposed for etching, the etching precursors selected to have high selectivity between the first and the second layers 312a, 312b, and thus are be able to target and laterally etch only either the first layer 312a or the second layer 312b (the example shown in FIG. 3B) without attacking or damaging the other (i.e., non-target) layer. After a desired width of the targeted material is removed from the substrate 302, forming a recess for manufacturing nanowire spacers, which will be described in detail below, the lateral etching process at operation 204 may then be terminated.

In the example depicted in FIG. 3B, the etching precursors are selected particularly to etch the second layer 312b without attacking or damaging the first layer 312a. In the example depicted in FIG. 3B, the etching precursors are selected to particularly etch the second layer 312b without attacking or damaging the first layer 312a. In one example wherein the first layer 312a is an intrinsic epi-Si layer and the second layer 312b is a SiGe layer formed on the substrate 302, the etching precursor selected to etch the second layer 312b include at least a carbon fluorine containing gas. Suitable examples of the carbon fluorine containing gas may include $CF_4$, $C_4F_6$, $C_4F_8$, $C_2F_2$, $CF_4$, $C_2F_6$, $C_5F_8$, and the like. A reacting gas, such as $O_2$ or $N_2$ may also be supplied with the carbon fluorine containing gas from the remote plasma source to promote the etching process. Further, a halogen containing gas may be supplied to the substrate surface to generate a plasma by a RF source power or a bias RF power or both, to further assist the etching process. Suitable halogen containing gas may be supplied into the processing chamber include HCl, $Cl_2$, $CCl_4$, $CHCl_3$, $CH_2Cl_2$, $CH_3Cl$ or the like. In one example, a $CF_4$ and $O_2$ gas mixture may be supplied to the substrate surface to laterally etch the second layer 312b.

In one example, the chemical precursors selected to be supplied in the lateral etching mixture may be varied for different film layer etching request. For example, when the first layer 312a is an intrinsic epi-Si layer and the second layer 312b being etched is a material other than SiGe, such as a doped silicon material, the etching precursor selected to etch the second layer 312b, e.g., the doped silicon layer, be a halogen containing gas supplied into the processing chamber include $Cl_2$, HCl, or the like. The halogen containing gas, such as a $Cl_2$ gas, may be supplied to the substrate surface for etching.

At operation 206, after the lateral recess etching process, a selective oxide deposition may be performed to selectively form an oxidation layer selectively on certain regions of the multi-material layer 212. As the first layer 312a and the second layer 312b in the multi-material layer 312 are fabricated from different materials, when the selective oxide deposition process is performed, the oxidation process may predominately occur on one material relative to the other material. In the example depicted in FIG. 3C wherein the first layer 312a is a silicon layer and the second layer 312b is a SiGe layer, the selective oxidation process may predominately occur on sidewalls 322 of the second layer 312b, rather than on the first layer 312a. The selective oxidation process occurred on the sidewalls 322 of the second layer 312b forms an oxidation layer 324 predominately on the sidewalls 322 of the second layer 312b. It is believed that SiGe alloy has higher activity than silicon dominated materials. Thus, when oxygen atoms are supplied, the oxygen atoms tend to react with Si atoms in SiGe alloy with a faster reacting rate, rather than with Si atoms from silicon dominated materials, thus providing a selective deposition process to predominately form the oxidation layer 324 on the sidewalls 322 of the second layer 312b of SiGe alloy, rather than on the first layer 312a. Minimum oxide residuals 344 may be found on the sidewalls 318 of the first layer 312a.

The oxidation process consumes the silicon atoms from in the second layer 312b to form the oxidation layer 324. As the Si—Ge bonding is relatively weaker than Si—Si bonding, the silicon elements from the Si—Ge bonding may be relatively easy to be activated and moved during the oxidation process when oxygen elements are diffused to react with the silicon atoms to form the oxidation layer 324 on the sidewalls 322.

In contrast, as the silicon atoms in the first layer 312a does not have the Ge atoms to serve as an active driver to release silicon elements from the bonding of Si—Ge to react with the oxygen elements during the oxidation process, the oxidation layer formation rate in the first layer 312a is significantly lower from the oxidation layer formation rate in the second layer 312b, thus providing a selective oxidation process that predominately forms the oxidation layer 324 on the sidewalls 322 of the second layer 312b rather than on the first layer 312a. In one example, the selectivity of the oxidation rate between the second layer 312b (e.g., a SiGe layer) and the first layer 312a (e.g., a silicon layer) is greater than 5:1, such as about 6:1 and 10:1.

Furthermore, temperature is also factored during the oxidation process. The process temperature is expected to have an exponential impact on Si and Ge oxidation rate and an exponential impact on the relative rates (e.g., such as the selectivity between the first and the second layer 312a, 312b). Pressure is expected to have a substantially linear impact on Si and Ge oxidation rates. Thus, by adjusting the temperature and the pressure, alone or in combination, during the oxidation process, independent control of deposition date and deposition selectivity can be achieved.

During processing of performing the selective oxidation process on the substrates 302, an environment of the high-pressure region 115, in the processing chamber 100 depicted in FIG. 1, is maintained at a temperature and pressure that maintains the processing fluid within the high-pressure region in a vapor phase. Such pressure and temperature is selected based on the composition of the processing fluid. In one example, high-pressure region 115 is pressurized to a pressure greater than atmosphere, for example greater than about 5 bars. In another example, high-pressure region 115 is pressurized to a pressure from about 10 to about 60 bars, such as from about 20 to about 50 bars. In another example, the high-pressure region 115 is pressurized to a pressure up to about 100 bars. During processing, the high-pressure region 115 is also maintained at a high temperature, for example, a temperature exceeding 205 degrees Celsius (based on the thermal budget requirement from the substrates 155 disposed on the cassette 150), such as between about 300 degrees Celsius and about 800 degrees Celsius, by the heaters 122 disposed within the outer chamber 110.

It is believed that the high pressure process may provide driving force to consume the silicon atoms where the oxygen atoms are present and diffused to so as to form the oxide layer 324 without damaging the lattice structures as formed from the Ge atoms in the film stack 312. By doing so, a portion of the silicon atoms may be gradually converted into the oxidation layer 324 without creating interfacial sites or atomic vacancies. In one implementation, the process temperature may be performed between about 100 degrees Celsius to about 1100 degrees Celsius, for example between 200 degree Celsius to about 1000 degrees Celsius, such as between about 300 degrees Celsius and about 800 degrees Celsius.

In one implementation, the oxidation process may be performed in a high pressure processing chamber, such as the processing chamber 100 depicted in FIG. 1, a rapid thermal oxidation chamber or a thermal environment (such as furnace). The oxidation process may be performed by using an oxygen containing gas mixture, such as an oxidizer, in a processing environment to react the multi-material layer 312. In one implementation, the oxygen containing gas mixture includes at least one of an oxygen containing gas with or without an inert gas. Suitable examples of the oxygen containing gas include steam, $O_2$, $O_3$, $H_2O$, $H_2O_2$, moisture and the like. Suitable examples of the inert gas supplied with the treatment gas mixture include at least one of Ar, $N_2$, He, Kr, and the like. In an exemplary embodiment, the oxygen containing gas supplied in the oxygen containing gas mixture is steam supplied at a pressure greater than 5 bar.

In one exemplary implementation, a process pressure is regulated a pressure greater than 5 bar, such as between 10 bar and 80 bar, such as between 15 bar and about 50 bar, for example between about 25 bar and 46 bar. The process temperature may be controlled at greater than 200 degrees Celsius, such as between about 250 degrees Celsius and about 600 degrees Celsius, such as between about 300 degrees Celsius and about 500 degrees Celsius.

In one implementation, the oxidation process is completed when a desired thickness of the oxidation layer 324 is formed on the sidewalls 322 of the second layer 312b. In one example, the oxidation layer 324 may have a thickness between about 1 nm and about 10 nm. The overall process time of the oxidation process may be determined by time mode after a desired portion the silicon atoms are predominantly reacted with the oxygen atoms to form the desired thickness of the oxidation layer 324. In one example, the substrate 302 is subjected to the selective oxidation process for between about 60 seconds to about 1200 minutes, such as between about 5 and 10 minutes, depending on the oxidation rate of the second layer 312b, pressure and flow rate of the gas. In an exemplary implementation, the substrate 302 is exposed to the oxidation processes for about 600 seconds or less.

Figure 3D:
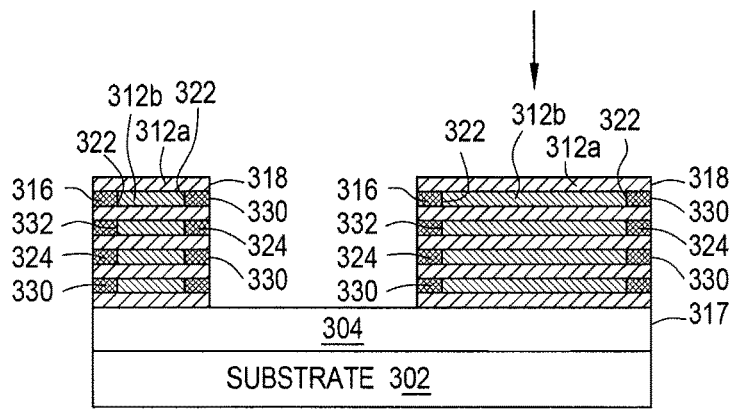

At operation 208, a gentle surface clean process is performed to selectively remove the oxide residuals 344, if any, from the film stack 312 without damaging the surfaces of the film stack 312, as shown in FIG. 3D. The oxide residuals 344 may be removed by dry etching process or wet etching process as needed. After the oxide residuals 344 are removed, the sidewall 318 of the first layer 312a is then exposed, ready for forming additional layers thereon as needed. The gentle surface clean process removes the excess oxide residuals 344 from the sidewall 318 of the first layer 312a as well as a portion of the excess oxide residuals 344 from the oxidation layer 324 on the second layer 312b, thus forming a vertical sidewall 330 aligned with the sidewall 318 of the first layer 312a.

In the example wherein the excess oxide residuals 344 is not found or abundant, the gentle surface clean process at operation 208 may be eliminated as needed.

Figure 3E:
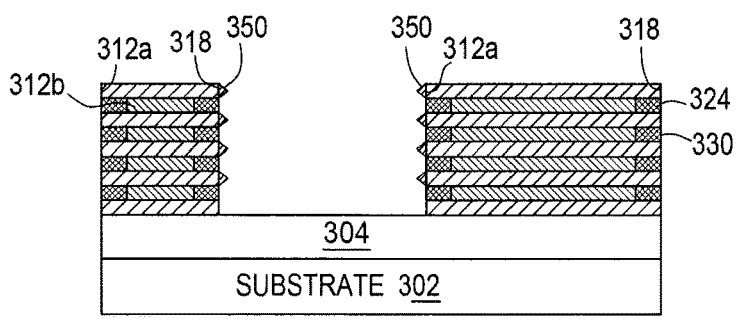

At operation 310, after the oxide residuals 344 are removed and the sidewall 318 of the first layer 312a is exposed, a selective epi-deposition process is performed. The deposition process utilized herein is an epitaxial growth process. The epitaxial growth process may form selectively form a material layer 450 on a silicon surface, such as the sidewall 318 of the first layer 312a, as shown in FIG. 3E.

Figure 3F:
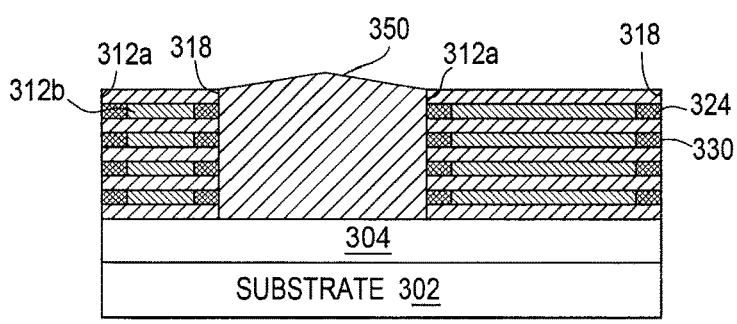

The material layer 350 may then be continuously grown to form a shaped structure, such as a diamond like top structure, of the material layer 350, as shown in FIG. 3F. The epitaxial growth process performed at operation 310 may provide a selective deposition process to form silicon materials predominately atop the sidewall 318 of the first layer 312a, which is a silicon material, as well as on the substrate 302 (when the optional material layer 304 is not present), which is also a silicon material.

The epitaxial growth of the silicon naturally grows onto silicon materials, such as the diamond like top structure of the material layer 350, on the substrate 302. As the natural shape of the diamond like top structure is controlled by the crystallographic orientation of the silicon material in <111> plane, which normally has the slowest epitaxial growth rate. Thus, the growth rates of the diamond like top structure of the material layer 350 are often different on different surfaces of the diamond like top structure of the material layer 350, such as different growth rates found from a horizontal surface or from a vertical surface. While different growth rates are often occurred at different surfaces with different crystallographic orientations, the resultant shape of the material layer 350 then has a diamond like top structure, rather than a horizontal planar surface.

The diamond like top structure of the material layer 350 may later be utilized to form source/drain or gate regions of a gate structure. The multi-material layer 312 of the first layer 312a and the second layer 312b with the oxidation layer 324 formed on the sidewall 322 may be utilized as nanowires in a field effect transistor (FET) with reduced parasitic capacitance and minimum device leakage.

Figure 4:
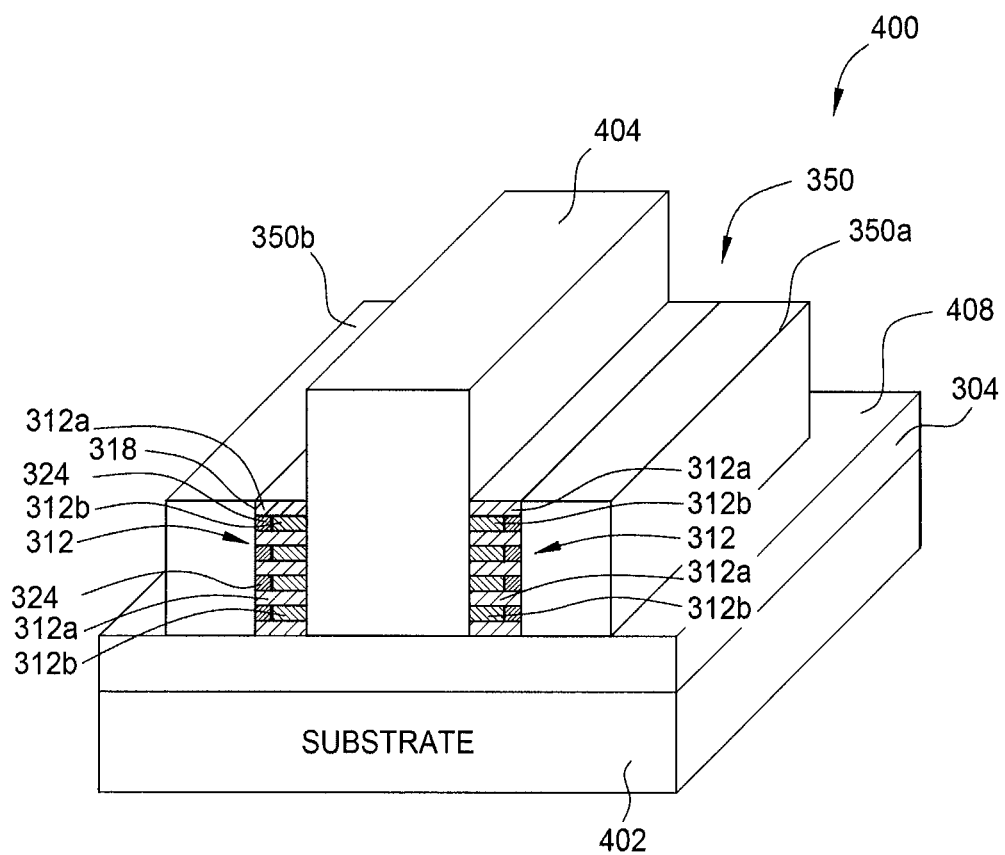
FIG. 4 depicts a schematic view of an example of a horizontal gate-all-around (hGAA) structure.

FIG. 4 depicts a schematic view of the multi-material layer 312 having pairs of the first layer 312a and the second layer 312b with the oxidation layer 324 formed therein utilized in a horizontal gate-all-around (hGAA) structure 400. The horizontal gate-all-around (hGAA) structure 400 utilizes the multi-material layer 312 as nanowires (e.g., channels) between source/drain anchors, formed from the material layer 350 (also shown as 350a, 350b for source and drain anchors, respectively) and a gate structure 404. The oxidation layer 324 formed at the bottom (e.g., or an end) of the second layer 312b may assist managing the interface wherein the second layer 312b is in contact with the gate structure 404 and/or the source/drain anchors 350a, 350b so as to reduce parasitic capacitance and maintain minimum device leakage.

Thus, methods for forming nanowire structures with reduced parasitic capacitance and minimum device leakage for horizontal gate-all-around (hGAA) structures are provided. The methods utilize selective oxidation process with high process pressure, such as greater than 5 bar, to selectively form an oxidation layer on certain types of material from a multi-material layer so as to form nanowire structures with reduced parasitic capacitance and minimum device leakage at the interface that may be later utilized to form horizontal gate-all-around (hGAA) structures. Thus, horizontal gate-all-around (hGAA) structures with desired type of material and device electrical performance may be obtained, particularly for applications in horizontal gate-all-around field effect transistors (hGAA FET).

While the foregoing is directed to embodiments of the present invention, other and further embodiments of the invention may be devised without departing from the basic scope thereof, and the scope thereof is determined by the claims that follow.

The invention claimed is:

1. A method of forming nanowire structures on a substrate comprising:
   supplying an oxygen containing gas mixture to a multi-material layer on a substrate in a processing chamber, wherein the multi-material layer includes repeating pairs of a first layer and a second layer, the first and the second layers having a first group and a second group of sidewalls respectively exposed through openings defined in the multi-material layer, wherein the second layer comprises a silicon and germanium containing material;
   maintaining the oxygen containing gas mixture in the processing chamber at a process pressure at greater than 5 bar;
   preferentially reacting silicon elements from the silicon and germanium containing material of the second layer with oxygen elements from the oxygen containing gas mixture; and
   selectively forming an oxidation layer on the second group of sidewalls in the second layer in the presence of the oxygen containing gas mixture, wherein a ratio of an oxidation rate of the second group of sidewalls to the first group of sidewalls is greater than 5:1.

2. The method of claim 1, wherein supplying the oxygen containing gas mixture further comprises:
   maintaining a substrate temperature at greater than 200 degrees Celsius.

3. The method of claim 1, wherein oxygen containing gas mixture includes at least an oxygen containing gas selected from a group consisting of $O_2$, $O_3$, $H_2O$, $H_2O_2$, or steam.

4. The method of claim 1, wherein oxygen containing gas mixture includes steam.

5. The method of claim 1, wherein the first layer of the multi-material layer is an intrinsic silicon layer and the second layer of the multi-material layer is a SiGe layer while the substrate is a silicon substrate.

6. The method of claim 1, further comprising:
   forming horizontal gate-all-around (hGAA) structures using the openings defined in the multi-material layer.

7. The method of claim 1 further comprising:
   performing a cleaning process to remove oxide residuals from the substrate.

8. The method of claim 1, wherein the multi-material layer includes at least 2 repeating pairs.

9. The method of claim 1, wherein the oxidation layer has thickness between about 1 nm and about 10 nm.

10. The method of claim 1, wherein maintaining the process pressure at greater than 5 bar further comprises:
    maintaining the process pressure at between about 10 bar and about 60 bar.

11. The method of claim 1, further comprising:
    performing an epitaxial deposition process to form a shaped structure from the first group of the sidewalls from the first layers.

12. A method of forming nanowire structures on a substrate comprising:
    predominantly forming an oxidation layer on a portion of a multi-material layer disposed on a substrate, wherein the multi-material layer includes repeating pairs of a first layer and a second layer, wherein the second layer comprises a silicon and germanium containing material, the first and second layers having a first group and a second group of sidewalls respectively exposed through openings defined in the multi-material layer, wherein the oxidation layer is selectively formed on the second group of the sidewalls in the second layer and a ratio of an oxidation rate of the second group of sidewalls to the first group of sidewalls is greater than 5:1, wherein predominately forming the oxidation layer further comprises:
    preferentially reacting silicon elements from the silicon and germanium containing material of the second layer with oxygen elements supplied from an oxygen containing gas while forming the oxidation layer; and
    maintaining a process pressure at greater than 5 bar while forming the oxidation layer.

13. The method of claim 12, wherein the first layer of the multi-material layer is an intrinsic silicon layer and the second layer of the multi-material layer is a SiGe layer while the substrate is a silicon substrate.

14. The method of claim 12, wherein the multi-material layer is utilized to form nanowires or channels in horizontal gate-all-around (hGAA) structures.

15. The method of claim 12, further comprising:
    maintaining a substrate temperature at greater than 200 degrees Celsius while forming the oxidation layer.

16. The method of claim 12, wherein the oxidation layer is formed by supplying an oxygen containing gas selected from a group consisting of $O_2$, $O_3$, $H_2O$, $H_2O_2$, steam to the multi-material layer.

17. The method of claim 16, wherein oxygen containing gas mixture includes steam or moisture.

18. A method of forming nanowire structures on a substrate comprising:
    predominantly forming an oxidation layer on a portion of a multi-material layer disposed on a substrate, wherein the multi-material layer includes repeating pairs of a silicon layer and a SiGe layer, the silicon layer and the SiGe layer having a first group and a second group of sidewalls respectively exposed through openings defined in the multi-material layer, wherein the portion wherein the oxidation layer is selectively formed on is on the second group of the sidewalls in the SiGe layer, wherein a ratio of an oxidation rate of the second group of sidewalls to the first group of sidewalls is greater than 5:1, wherein predominately forming the oxidation layer further comprises:
    preferentially reacting silicon elements from the silicon and germanium containing material of the second layer with oxygen elements supplied from an oxygen containing gas while forming the oxidation layer; and
    maintaining a process pressure at greater than 5 bar while forming the oxidation layer.

19. The method of claim 18, the oxidation layer is formed by supplying steam or moisture to the multi-material layer.

20. The method of claim 18, further comprising:
    maintaining a substrate temperature at between about 300 degrees Celsius and about 500 degrees Celsius while forming the oxidation layer.

* * * * *